(12) United States Patent
Matthies et al.

(10) Patent No.: US 6,476,783 B2
(45) Date of Patent: *Nov. 5, 2002

(54) CONTRAST ENHANCEMENT FOR AN ELECTRONIC DISPLAY DEVICE BY USING A BLACK MATRIX AND LENS ARRAY ON OUTER SURFACE OF DISPLAY

(75) Inventors: Dennis Lee Matthies, Princeton, NJ (US); Zilan Shen, Lawrenceville, NJ (US); Roger Green Stewart, Neshanic Station, NJ (US); James Harold Atherton, Ringoes, NJ (US)

(73) Assignee: Sarnoff Corporation, Princeton, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/250,347

(22) Filed: Feb. 16, 1999

(65) Prior Publication Data
US 2002/0050958 A1 May 2, 2002

Related U.S. Application Data

(60) Provisional application No. 60/074,922, filed on Feb. 17, 1998.

(51) Int. Cl.[7] .............................. G09G 3/32; G09G 3/00; H01L 33/00; G02F 1/1333
(52) U.S. Cl. .............................. 345/82; 345/32; 257/98; 257/435; 349/110
(58) Field of Search .............................. 349/44, 57, 73, 349/95, 110, 111, 122, 112, 137, 138, 56; 257/59, 91, 98, 435, 436, 437; 438/29, 30; 345/32, 55, 60, 76, 82, 84, 85, 80

(56) References Cited
U.S. PATENT DOCUMENTS 4,843,280 A 6/1989 Lumbard et al. ............ 313/500

(List continued on next page.)

FOREIGN PATENT DOCUMENTS

| EP | 0 560 072 A | 9/1993 |
| WO | 95/31876 | 11/1995 |

OTHER PUBLICATIONS

PCT Written Opinion in Int'l Appli No. PCT/US99/03375 dated May 5, 2000.

(List continued on next page.)

Primary Examiner—Steven Saras
Assistant Examiner—Paul A. Bell
(74) Attorney, Agent, or Firm—William J. Burke

(57) ABSTRACT

A display device having features which enhance the contrast of displayed images includes a pixel structure that defines an active pixel area and an inactive pixel area. The display device may be an emissive device such as an OLED or electroluminescent device, a transmissive device such as a liquid crystal light-valve device or a reflective device, such as a Bistable, Reflective Cholesteric (BRC) liquid crystal device. The ratio of the active pixel area to the total pixel area is less than 50 percent. The display device includes a transparent cover plate having a black matrix formed on the viewer side of the cover plate. The display device may be a tiled display in which case the black matrix is formed on an integrator plate to which the individual tiles are bound to form the complete display device. For reflective or emissive display materials, the display device includes an electronics section including a circuit board which provides driving signals for the pixels of the display device. The electronics section is bound to the display section by an adhesive. To provide a light-absorptive background for the active pixel elements, the circuit board or the adhesive are colored black. The individual pixel elements of the display device include four sub-pixel components separated by portions of the inactive pixel area, which four sub-pixel components together define the active area of the pixel. A lens system is provided on the viewer surface of the display to concentrate light emitted by the active area of the pixel elements into a smaller area, thus decreasing the aperture of the display. Areas between the lenses on the viewer surface of the display are coated with a black material to form a black matrix. A black material is selectively deposited on the front cover plate before applying the metal row electrodes to prevent the row electrodes from providing a reflective surface to the viewer.

17 Claims, 8 Drawing Sheets

U.S. PATENT DOCUMENTS

| | | | | |
|---|---|---|---|---|
| 5,099,301 A | | 3/1992 | Kikinis | 257/91 |
| 5,101,279 A | | 3/1992 | Kurematsu et al. | 349/95 |
| 5,229,753 A | * | 7/1993 | Berg et al. | 340/679 |
| 5,384,649 A | | 1/1995 | Takimoto et al. | 349/113 |
| 5,568,292 A | * | 10/1996 | Kim | 349/110 |
| 5,606,194 A | * | 2/1997 | Lebrun et al. | 349/110 |
| 5,644,327 A | | 7/1997 | Onyskevych et al. | 345/80 |
| 5,661,531 A | | 8/1997 | Greene et al. | 849/73 |
| 5,680,188 A | | 10/1997 | Yoshida et al. | 349/113 |
| 5,689,315 A | | 11/1997 | Fushimi | 345/57 |
| 5,691,788 A | * | 11/1997 | Kim | 349/110 |
| 5,703,394 A | | 12/1997 | Wei et al. | 257/433 |
| 5,716,211 A | * | 2/1998 | Vetter | 434/107 |
| 5,718,992 A | * | 2/1998 | Sato et al. | 349/110 |
| 5,739,545 A | | 4/1998 | Guha et al. | 257/103 |
| 5,739,800 A | | 4/1998 | Lebby et al. | 257/103 |
| 5,756,026 A | * | 5/1998 | Sanchez et al. | 264/138 |
| 5,757,452 A | * | 5/1998 | Masaki et al. | 349/110 |
| 5,771,039 A | | 6/1998 | Ditzik | 845/178 |
| 5,784,133 A | * | 7/1998 | Kim et al. | 349/110 |
| 5,796,375 A | * | 8/1998 | Hollowman | 334/75.2 |
| 5,805,117 A | * | 9/1998 | Manzurek et al. | 345/903 |
| 5,815,229 A | * | 9/1998 | Shapiro | 349/95 |
| 5,818,404 A | | 10/1998 | Lebby et al. | 345/82 |
| 5,847,690 A | * | 12/1998 | Boie et al. | 345/104 |
| 5,847,783 A | | 12/1998 | Hiramoto et al. | |
| 5,867,236 A | | 2/1999 | Babuka et al. | 349/73 |
| 5,889,568 A | * | 3/1999 | Seraphim et al. | 349/73 |
| 5,989,945 A | | 11/1999 | Yudasaka et al. | |
| 6,005,649 A | | 12/1999 | Krusius et al. | |
| 6,044,231 A | * | 3/2000 | Soshi et al. | 396/315 |
| 6,057,898 A | | 5/2000 | Itoh et al. | |
| 6,100,861 A | | 8/2000 | Cohen et al. | |
| 6,229,506 B1 | * | 5/2001 | Dawson et al. | 345/82 |
| 6,229,508 B1 | * | 5/2001 | Kane | 345/82 |
| 6,264,555 B1 | * | 7/2001 | Glazman et al. | 345/211 |
| 6,314,483 B1 | | 11/2001 | Goto et al. | |
| 6,339,414 B1 | | 1/2002 | Todokoro et al. | |

OTHER PUBLICATIONS

G. Mueller, R. Mach, G. U. Reinsperger, L. Schrottke; "Tiling Thin–Film Electroluminescent Displays," SID 91 Digest, pp. 567–570.

S.C. Thayer, "Late–News Paper: Modular Wall–Size IC–Driven Flat–Panel Displays," SID 92 Digest, pp. 950–953.

N. Mazurek, T. Zammit, "A 51–in.–Diagonal Tiled LCD VGA Monitor," SID 93 Digest, pp. 614–617.

S. C. Thayer, "Active–Driven TFEL Displays Using Ceramic Tiling," SID 93 Digest, pp. 618–621.

International Search Report PCT/US/03375.

* cited by examiner

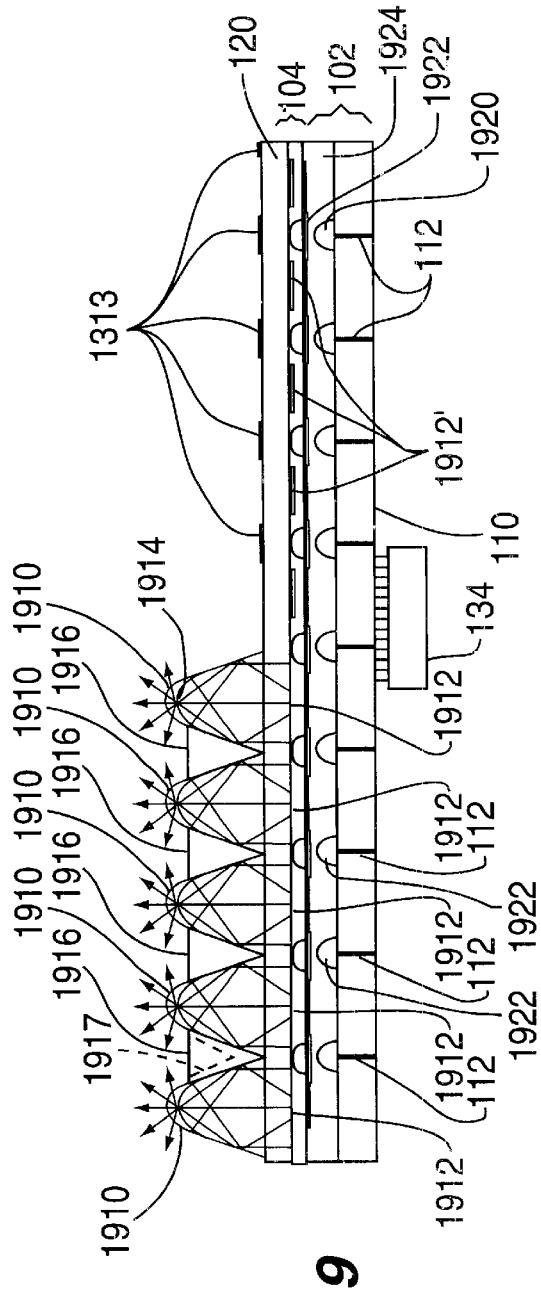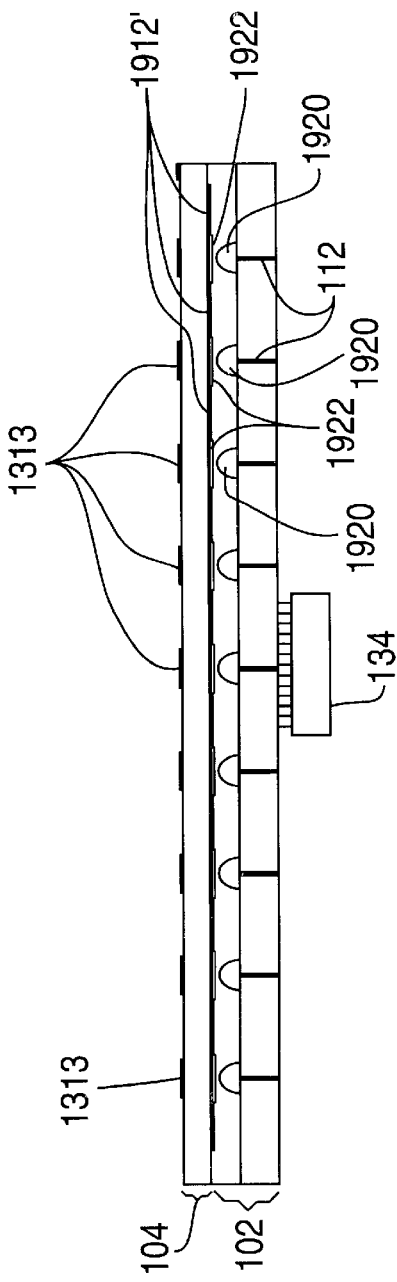

CONTRAST ENHANCEMENT FOR AN ELECTRONIC DISPLAY DEVICE BY USING A BLACK MATRIX AND LENS ARRAY ON OUTER SURFACE OF DISPLAY

This patent application claims the benefit of priority from U.S. Provisional application Ser. No. 60/074,922 filed Feb. 17, 1998.

BACKGROUND OF THE INVENTION

The present invention concerns electronic display devices and, in particular, electronic display devices having features which enhance the contrast of images displayed on the devices.

Electronic displays are devices that produce patterns of light in response to electrical signals. Flat panel displays typically are fabricated with top and bottom substrates that contain the display materials. Display devices in which the display materials generate light are known as emissive displays. One type of display materials that are used in electronic displays is organic light emitting diode (OLED) materials. Other types of emissive displays include plasma displays, field emissive displays and electroluminescent displays. Another type of display device only passes or reflects light. Displays of this type are known as light-valves.

For both emissive and light valve displays, it is important that the displays be bright and yet exhibit strong contrast. Contrast is one of the most important performance parameters of a display. It is an important factor in the ability to use information that is displayed, and it plays a strong role in buyer preference. The simple definition is that the contrast of an emissive display is the ratio of the useful light (e.g. the signal) emitted by the display to the unwanted light coming form the display (e.g. the noise). In all practical environments, the unwanted light is dominated by reflected light from the ambient.

Reflected light can be either specular or diffuse. Specular reflection is particularly annoying because the viewer sees a reflected image of the source of the ambient light superimposed on the image, and because it is concentrated at the specular reflection angle it degrades the image contrast at that specific angle. Diffusely reflected light superimposes a haze over the displayed image that reduces contrast, limits the range of viewable gray scale and consequently limits the information content detectable by the viewer.

It is desirable to minimize the reflected light from a display surface in order to maximize the performance of the display device. It is also desirable to have any reflective component that remains to be diffusive rather than specular

SUMMARY OF THE INVENTION

The present invention is embodied in a display device having features which enhance the contrast of displayed images.

According to one aspect of the invention, the display device has active elements which define a relatively small aperture and a black matrix positioned above the plane of the active elements.

According to another aspect of the invention, the display device is a tiled display device and the black matrix is implemented on the surface of an optical integrator plate on to which the individual tiles are mounted.

According to another aspect of the invention, the display device includes an electronics section and a display section which are joined by an adhesive and the adhesive is dark-colored to absorb ambient light which is transmitted through the display section.

According to another aspect of the invention, the display device has a pixel structure which defines a plurality of spaced sub-pixel elements which, together, define an aperture of less than 50%

According to yet another aspect of the invention, the display device includes a plurality of lenses which act to concentrate light provided by the active elements into an area smaller than the area of the active elements. The lenses may be reflective, refractive or a combination of reflective and refractive.

According to another aspect of the invention, the lenses are formed with relatively steep sides wherein adjacent lenses form a light trap which inhibits reflection of light which enters the area between lenses.

According to yet another aspect of the invention, the area between the lenses is coated with a dark-colored material to form a black matrix structure.

According to another aspect of the invention, the pixel structure includes a metal row electrode, the active element, a transparent column electrode and a transparent front panel, wherein the portions of the metal row electrode which may be visible from the viewer side of the display are coated with or deposited upon a dark-colored material.

DETAILED DESCRIPTION

FIG. 19 is a cut-away side plan view of an exemplary display structure which employs a lens structure to concentrate light provided by the active pixel area into a relatively small aperture.

FIG. 20 is a cut-away side plan view of an exemplary two-part display structure.

DETAILED DESCRIPTION

Figure 1:
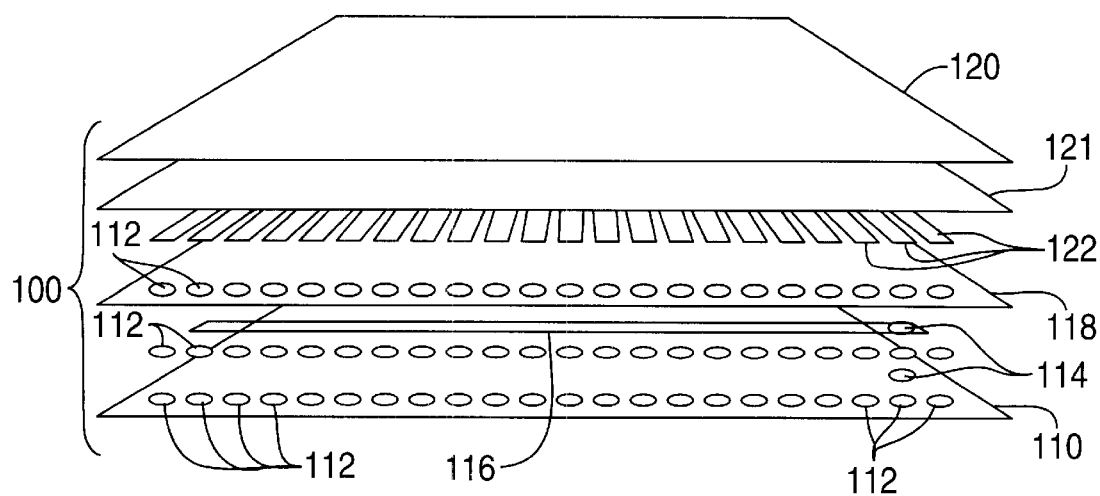
FIG. 1 is an exploded perspective drawing of an exemplary display structure which may use contrast enhancements according to the present invention.

In the exemplary embodiments described below, the drawing figures are not to scale. Indeed, features of the drawing figures have been exaggerated in order to facilitate description of the invention.

Contrast enhancement depends, at least to some extent, on the kind of display device. The present invention is described in terms of an emissive display device which uses OLEDs for the active pixel element. It is contemplated, however, that the contrast enhancement techniques disclosed herein may be used with other types of emissive displays, for example, electroluminescent, cathodoluminescent, and plasma displays as well as for reflective and light valve displays, such as liquid crystal display devices. An exemplary reflective display may be formed, for example from Bistable, Reflective Cholesteric (BRC) liquid crystal material which provides for a low power, bistable display. It is helpful to understand the structure of the display device in order to understand how contrast enhancement features according to the present invention may be used with the display device.

FIG. 1 is an exploded perspective drawing which illustrates an exemplary structure of an OLED display device 100. The device shown in FIG. 1 may be formed as a separate electronics section and display section or it may be formed a single unit. As described below, connections to the row and column electrodes of the display device are made along two perpendicular edges of the device.

When the display device shown in FIG. 1 is formed as a single unit, it is built on a circuit board 110. This circuit board may include, for example, an electronics module (not shown) which provides the row and column driving signals for the display device. The electronics module is coupled to the row and column electrodes of the display device through column vias 112 and row vias 114. Only one row via 114 is shown in FIG. 1. The row vias 114 connect to row electrodes 116 which may be painted or printed on the top surface of the circuit board 110. The display material 118 is deposited on top of the row electrodes 114. In the drawing FIG. 1, the display material 118 is illustrated as a solid sheet. This material, however, may be individual OLED cells including an electron injecting material such as calcium, a light emitting polymer layer and a hole transport polymer layer. Alternatively, cells of another emissive material may be deposited on the row electrodes 114. The row electrodes 114 may be formed from a metal such as aluminum, magnesium or calcium or from polysilicon.

Column electrodes 122 are formed on top of the display material 118. The column electrodes 122 are connected to the circuit board through the vias 112 which extend through each level of the display tile from level 110 through level 118. Each column electrode 122 is electrically coupled to a respectively different via 112. The column electrodes 122 are typically formed from a transparent conductive material such as indium-tin oxide (ITO). In the exemplary embodiment of the invention, level 121, formed above the column electrodes 122 may be an optical filter such as a neutral gray filter, patterned color filter or polarizing filter. Alternatively, level 121 may be a patterned black matrix which covers the inactive areas of the display layer 118 with black lines while providing openings for the active elements of the display material.

When the level 121 is a neutral gray or patterned color filter, it may act to enhance the contrast of the display because ambient light that passes through the filter and is reflected by the display material passes through the filter twice while light provided by the active pixel elements only passes through the filter once. The patterned color filter, is formed with individual filter sections covering corresponding pixel colors (e.g. red filters over red pixels). These filters have a further advantage as most of the ambient light will be absorbed while very little of the light provided by the active pixel element is absorbed.

The final layer of the display tile shown in FIG. 1, is a transparent cover plate 120 which may be formed from float glass or other transparent material.

If the tile shown in FIG. 1 is formed as separate electronics and display sections, then the display section may be formed, by depositing the optional layer 121 on the back surface of the transparent cover 120. Next, the transparent column electrodes 122 are deposited, then the OLED materials 118 are formed on the column electrodes 122 and the row electrodes 114 are formed to make contact with the OLED materials.

The electronics section is formed by forming vias in the circuit board 110 and conductive traces (not shown) on the back side of the circuit board 110 to connect the electronics module (not shown) to the vias. The exemplary separate electronics and display sections shown in FIG. 1 may be joined by bump-bonding the row and column vias along their edges or by inserting conductive elements, for example wires, into the row and column vias on one of the sections such that the conductive elements protrude from the vias. The conductive elements would then mate with the corresponding vias on the other section when the sections are joined. As described below, contrast of a display device such as that shown in FIG. 1 may be enhanced by forming the circuit board 110 from a dark material, painting the front (top) surface of the circuit board 110 a dark color or by using a dark-colored adhesive to join the electronics section to the display section, if the display device is formed in two sections. Except for the row electrodes 116 and the OLED materials, all of the layers above the circuit board layer are transparent. The dark-colored backing thus forms a black matrix into which the pixel materials are placed. To achieve a more effective black-matrix effect, the row electrodes may be formed from a transparent conductor such as ITO or from a metal such as calcium, magnesium or aluminum, in which the areas of the metal electrodes that would be visible to a viewer are coated with a dark colored (e.g. black) material when the display section is made. In this alternative structure, the only non-transparent material is the emissive OLED material.

Figure 2:
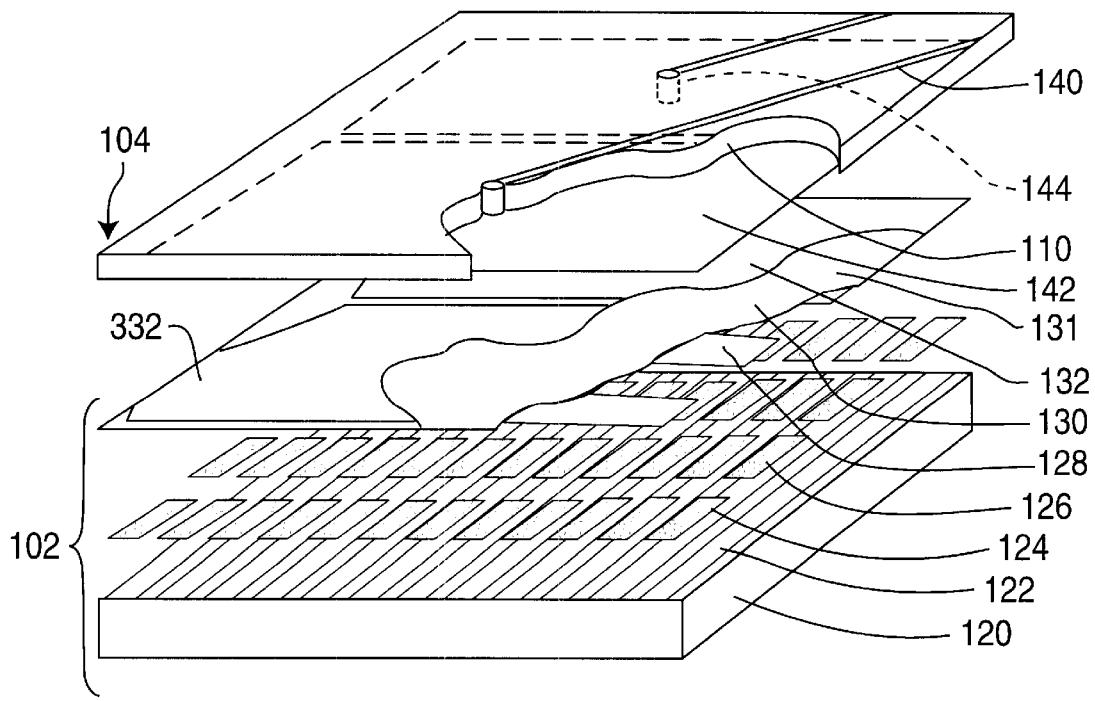
FIG. 2 is an exploded perspective drawing which illustrates an alternative display structure that may use contrast enhancements according to the present invention.

FIG. 2 is an exploded perspective diagram which shows an alternative exemplary display structure. The display structure shown in FIG. 2 is formed in two parts: a display section 102 and an electronics section 104.

The display section 102 includes a transparent front plate 120 which may be made, for example, from float glass. Transparent column electrodes 122 are formed on the front plate 120 from transparent conductor, such as ITO. These bands may be formed by depositing and then etching an ITO layer or by selectively depositing individual bands of ITO. The red, green and blue OLED materials or other display materials 124 and 126 are deposited on top of the column electrodes to define the active area of the pixels. The OLED materials typically include a hole transport polymer layer (not shown), which is deposited on top of the column electrodes 122 and a light emitting polymer layer (not shown) which is deposited on top of the hole transport polymer layer (not shown). As described below with reference to FIGS. 5 and 6, it is desirable for the display materials 124 and 126 to occupy only a portion (e.g. less than 50 percent and desirably about 25 percent) of the pixel area. An electron emitting layer (not separately shown) which may be formed, for example, from calcium, is deposited on top of the OLED materials 124 and 126. The row electrodes 128 are formed on top of the display materials 124 and 126. An optional insulating layer 130 is formed on top of the row electrodes. The exemplary insulating layer 130 may be formed from any of a number of insulating materials. To protect the display materials, the insulating layer 130 is desirably formed using low-temperature processes. Exemplary materials include Polyimide or other low-temperature inorganic materials. As set forth below, it may be advantageous for the insulating material 130 to be transparent or at least translucent. The insulating layer 130 may be applied using thick film or thin film deposition techniques. The insulating layer 130 includes a plurality of openings 131 aligned with the row electrodes 128 and column electrodes 122.

On top of the insulating layer are deposited a plurality of optional connecting plates 132. The plates 132 may be formed using, for example, vapor deposited aluminum or a metallic ink or paste, such as silver combined with a solvent, which is deposited using thick film processes. As described below with reference to FIGS. 9 through 11, the connecting plates 132 are coupled to the column electrodes 122 and row electrodes 128 by vias which extend through the openings in the insulating materials. Each of the exemplary connecting plates makes electrical contact with only one row electrode or one column electrode. To ensure that a good connection is made, however, each connecting plate 132 may connect to its corresponding row or column electrode at several locations.

The insulating layer 130 and connecting plates 132 are optional. If these layers are not used, conductive bumps (not shown) may be formed which connect directly to the row electrodes 128 and the column electrodes 122. As described below, these conductive bumps may be positioned to mate with corresponding conductive bumps on the display section or with the row and column electrodes directly. To ensure that a good electrical contact is made, several conductive bumps may be formed to make electrical contact with each row electrode 128 and each column electrode 122.

The electronics section 104 includes image processing and display driving circuitry (not shown in FIG. 2) a circuit board 110, which may be, for example, a thin sheet of alumina ($Al_2O_3$), deposited electrical conductors 140, optional connecting pads 142 and vias 144 which electrically connect the conductors 140 to the connecting pads 142 through the circuit board 110. The conductors 142, vias 144 and connecting pads 142 may all be formed using thick film deposition processes to apply a metallic ink or paste. The connecting pads 142 may also be formed from vapor-deposited aluminum. There is a one-to-one relationship between the connecting pads 142 of the electronics section and the connecting plates 132 of the display section. In the exemplary embodiment of the invention, the connecting pads 142 and the connecting plates 132 are electrically connected by applying an anisotropically conductive adhesive between the display section and the electronics section.

It is contemplated, however, that other methods may be used to electrically connect the connecting pads to their respective connecting plates. For example, the connecting plates 132 and connecting pads 142 may be made from a deformable material and patterned to include a portion which extends above the plane of the pad or plate. When the electronics section is mated to the display section, the patterned material on the connecting plates 132 and connecting pads 142 come into contact and deform, providing an electrical connection between the corresponding connecting pads and plates. The pads 142 and plates 132 may also be connected by bump-bonding techniques or using wires that are implanted in one of the pads 142 or plates 132 and engage the plate 132 or pad 142 when the electronics section 104 is mated to its corresponding display section 102.

Alternatively, the connecting plates 132, connecting pads 142 and insulating layer 130 may be omitted and connection between the vias 144 and the row and column electrodes may be made by providing raised conductive bumps (not shown) on each of the vias 144 which are positioned to mate with corresponding raised conductive bumps (not shown) on the row and column electrodes of the display section 102.

In any of these configurations, the display section may be joined to the electronics section using a non-conductive adhesive, if the respective bumps come into direct contact, or by an anisotropic conductive adhesive. The exemplary anisotropic conductive adhesive may be formed, for example by suspending particles of a conductive material in an adhesive such that, the particles touch and form conductive paths when pressure is applied to the adhesive. Alternatively, the particles may be formed from a ferromagnetic material and may be aligned in a desired conductive direction (e.g. vertically) using an externally applied magnetic field. Further details of this sealing and connecting method are described below with reference to FIG. 20.

As described above with reference to FIG. 1, the contrast of the display device in FIG. 2 may be enhanced by adding a dark pigment to the adhesive which joins the electronics section 104 to the display section 102 or by using a clear or translucent adhesive and forming the circuit board 144 from a dark material to provide a dark background for the emissive materials 124 and 126. To provide the most contrast enhancement, it is desirable for the contact pads 142, contact plates 132 and insulating layer 130 to be omitted or, if present, to be transparent or translucent. Translucent pads 142 and plates 132 may be achieved by depositing these layers using thin-film techniques. In addition, as set forth above with reference to FIG. 1, it is desirable for the row electrodes to be masked from view by a dark-colored material or be formed from a transparent material.

Figure 3:
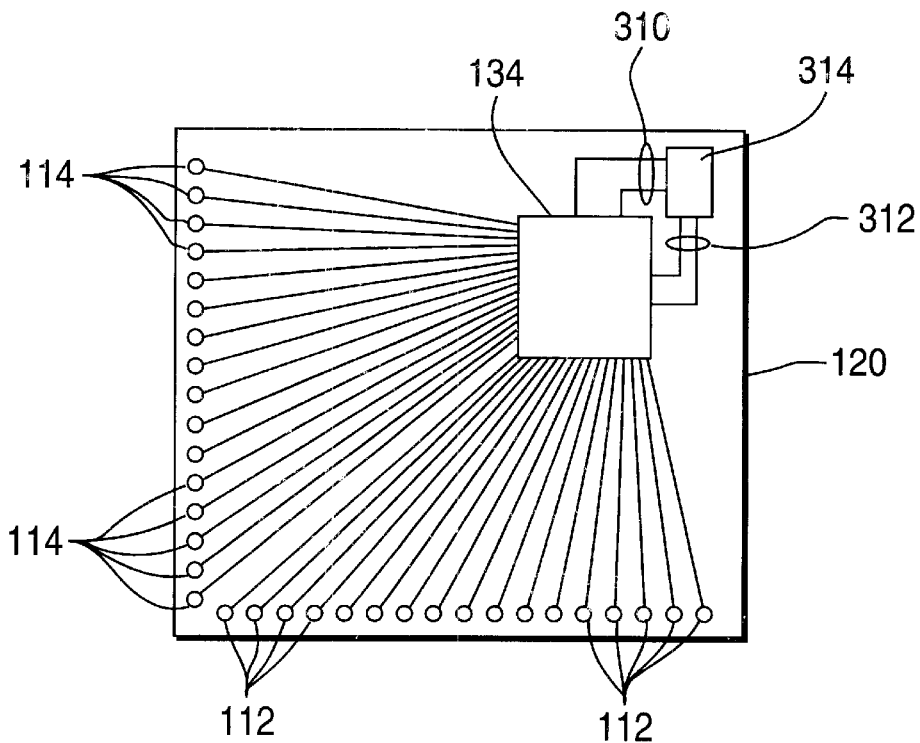
FIG. 3 is a back plan view of a tile having the structure shown in FIG. 1.

The display structures shown in FIGS. 1 and 2 may be used in a full-size display device or in a smaller tile. Many of the smaller tiles may be joined together to form a very large display device. FIG. 3 is a bottom plan view of a display tile having the structure shown in FIG. 1. As shown in FIG. 3, the circuit board 120 includes electronic circuitry 134 which is connected to the rows and columns of the display through the vias 114 and 112 respectively. In the exemplary embodiment of the invention, the circuit board 120 may be formed from ceramic green tape which is punched or drilled to form holes for the vias 112 and 114. The conductors 140 which connect the circuitry 134 to the vias 112 and 114 may be printed or painted onto the green tape and the via holes may be filled prior to firing. The conductive traces 140 are coupled to the vias 112 and 114 along the edge of the circuitry 134. The circuitry 134 is coupled to receive operational power via conductors 310 and to receive the data signal and timing information via conductors 312 and a connector 314.

Figure 4:
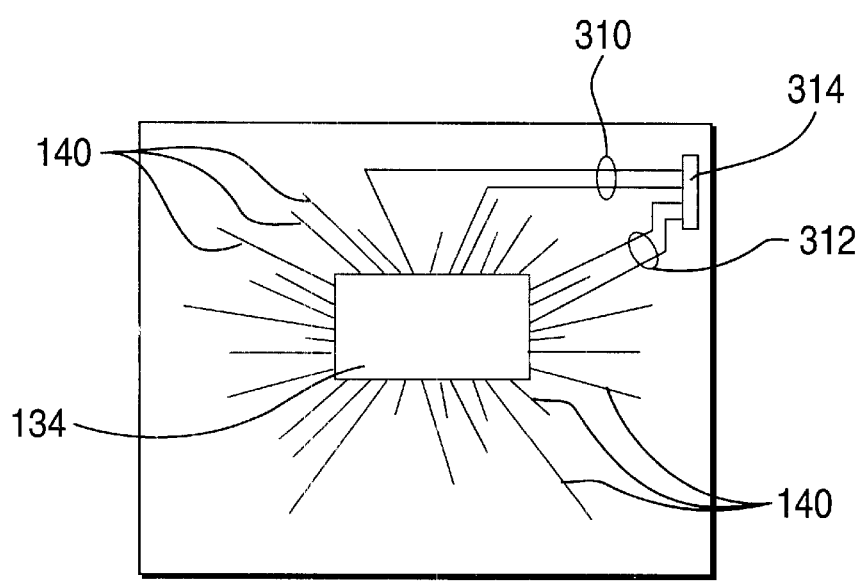
FIG. 4 is a back plan view of a tile having the structure shown in FIG. 2.

FIG. 4 is a bottom plan view of a display tile having the structure shown in FIG. 2. This tile also includes electronic circuitry 134, conductive traces 140 operational power conductors 310, data and timing signal conductors 312 and connector 314. The conductive traces 140 in this embodiment of the invention, however, are not limited to the edges of the tile but are connected to the row and column electrodes of the display device through interior pixel positions of the tile.

Figure 5:
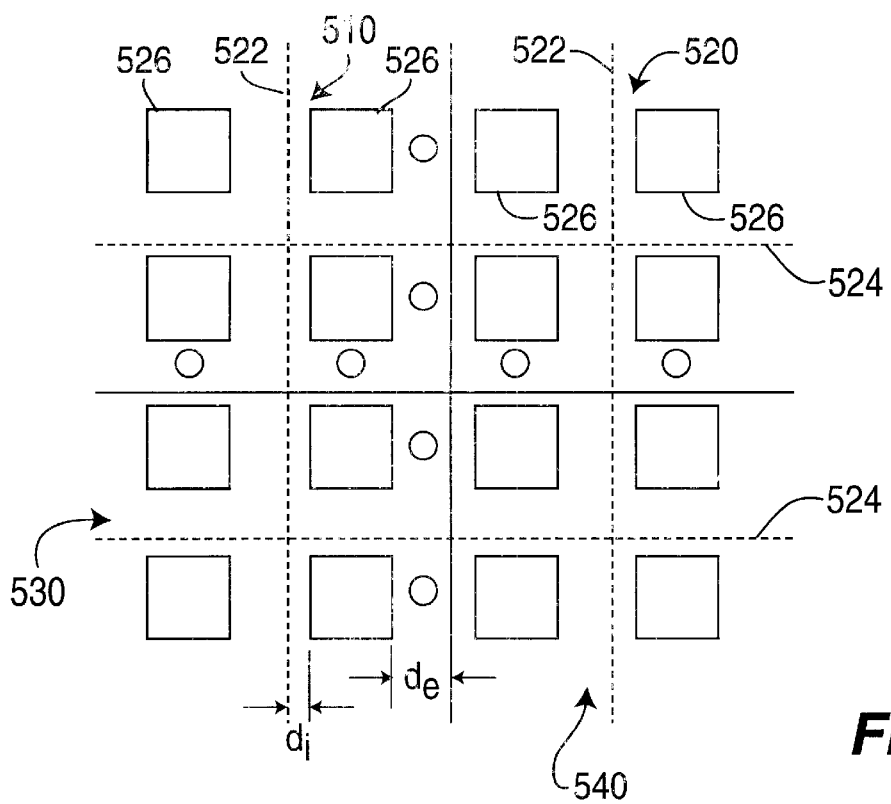
FIG. 5 is a front-plan view of four tiles of a tiled display, each tile having the structure shown in FIG. 1.

FIG. 5 is a pixel diagram which illustrates an exemplary pixel spacing that may be used in the tile having the structure shown in FIG. 1. The routing of the vias 112 and 114 along the edges of the tiles allows multiple tiles to be abutted in a way which renders the joint between the tiles virtually invisible. The pixel spacing shown in FIG. 5 allows the conductive vias to be arranged along the edge of the tile, without interrupting the continuity of the pixel spacing in the assembled tiled display. FIG. 5 illustrates portions of four tiles, 530, 540, 550, and 560. The dashed lines 524 and 522 illustrate pixel boundaries. These lines are provided only as a guide in understanding the pixel layout. The active portion 526 of the pixels occupies only about ¼ of the total pixel area. This defines a pixel aperture of approximately 25%. The aperture is the ratio of the active pixel area to the inactive pixel area. In this exemplary embodiment of the invention, the active region is not centered in the pixel area but is offset to the left and top as shown in FIG. 5.

As shown in FIG. 5, this spacing of the pixels leaves room along the edges of the display for the vias 114 and 112 to connect to the row and column electrodes of the pixel without interfering with the regular spacing of the pixels across tile boundaries. In the exemplary embodiment shown in FIG. 5, the distance $d_e$, which is the distance from the active region 526 to the edge of the tile, is approximately twice the distance $d_I$ which is the internal distance from the edge of the active area of the pixel 526 to the pixel boundary 112 or 114.

Although the pixel diagram shown in FIG. 5 has the active region of the pixel being offset both horizontally and vertically, it is contemplated that the active area may be offset only vertically. In this configuration, the contacts to the row electrodes are beneath the active pixel material and, thus, do not need to offset the active region of the pixel.

Figure 6:
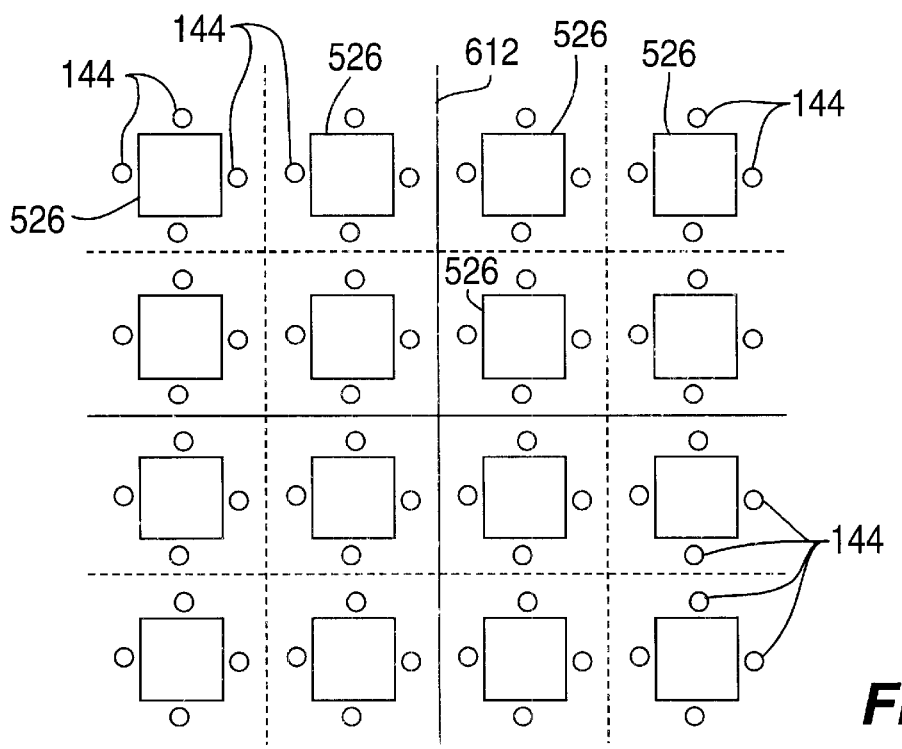
FIG. 6 is a front-plan view of four tiles of a tiled display, each tile having the structure shown in FIG. 2.

FIG. 6 is an alternative pixel layout, suitable for use for a tile such as that shown in FIG. 2. In the layout shown in FIG. 6, the active portions 526 of the pixels are centered in their respective pixel regions and the vias 144 which connect the row and column electrodes of the display to the electronics are formed between respective pixel elements. The distance between the edge of an active region 526 and the edge 612 of the display is equal on all sides of the tile and the distance from the center of the active pixel region to the edge is ½ of the pixel pitch. As described below with reference to FIGS. 12 and 12A, however, the distance between the center of an edge pixel and the edge of the tile may be slightly less than ½ of the pixel pitch in order to allow a mullion to be inserted and join adjacent tiles. As described below, mullions are typically used both to join tiles on the display device and to hide the edges where the tiles meet.

Figure 7:
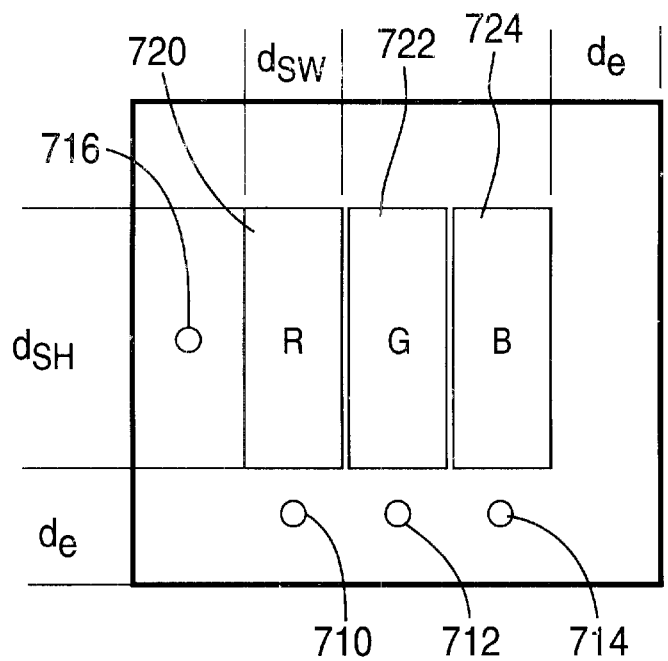
FIG. 7 is a partial front plan view of a single color pixel format for a display device having the structure shown in FIG. 2.
Figure 8:
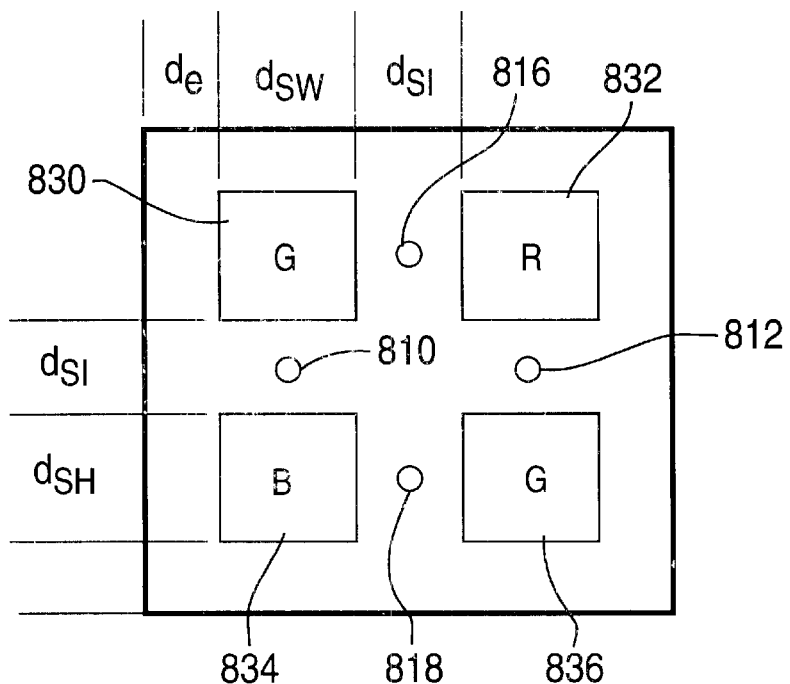
FIG. 8 is a partial front plan view of a an alternative single color pixel format for a display device having the structure shown in FIG. 2.

The displays described above have been, in general, monochrome displays. The pixels have a single emissive area which is controlled by a single row and column electrode pair. Color pixels may be implemented as shown in FIGS. 7 and 8. FIG. 7 shows a single pixel having separate red (R) 720, green (G) 722 and blue (B) 724 sub-pixels. The three sub-pixels 720, 722 and 724 each has a respective column electrode (not shown) which is connected to the electronics section by the vias 710, 712 and 714, respectively. A single row electrode (not shown) is used by all three of the sub pixels. This row electrode is coupled to the electronics section by the via 716, shown in phantom. The row electrode 716 is shown in phantom as it is beneath the row electrode and, so, would not be visible. The geometry of the triple sub-pixel structure is defined by $d_{SH}$, the height of the sub-pixel, $d_{SW}$, the width of the sub-pixel, and $d_e$, the distance from the active sub-pixel areas to the edge of the pixel area. For one exemplary embodiment of the invention, these dimensions are given in Table 1 in terms of the pixel pitch, P.

TABLE 1

| | |
|---|---|
| $d_{SH}$ | .5 P |
| $d_{SW}$ | .16 P |
| $d_e$ | .25 P |

FIG. 8 illustrates an alternative color pixel structure. This structure includes four sub-pixel elements, 830, 832, 834 and 836. Two of these sub-pixel elements, 830 and 836 emit green light when stimulated while the other two pixel elements, 832 and 834 emit red and blue light, respectively. This structure is known as a quad sub-pixel structure. The structure uses two green sub-pixels because more of the luminance information in a color display is in the green pixels than is in either of the red or blue pixels. Alternatively, if a particular display technology cannot produce light in one color band of the same intensity as light in another color band, the duplicate pixel may be of the low-emitting color. For an OLED display, for example, it may be advantageous for the two duplicated pixels to be red pixels instead of green. For an electroluminescent display, it may be advantageous for the duplicate pixel to be blue. Thus, the use of two sub-pixels of the same color allows for a brighter display in a variety of display technologies. In addition, the spacing of the sub-pixels of the quad pixel acts to reduce the visibility of the pixel structure and improve the perceived spatial resolution of the display device, even though the exemplary pixel structure shown in FIG. 8 has an aperture of approximately 25%. In addition, the spacing of the sub-pixels allows vias to be routed between the sub-pixel areas.

The pixel structure shown in FIG. 8 employs two row electrodes (not shown) and two column electrodes (not shown). The row electrodes are coupled to the electronics section by the vias 816 and 818 (shown in phantom) while the column electrodes are coupled to the electronics section by the vias 810 and 812. The geometry of the quad sub-pixel structure is defined by the dimensions $d_{SH}$, the height of the sub-pixel, $d_{SW}$, the width of the sub-pixel, $d_e$, the distance from the active sub-pixel areas to the edge of the pixel area, and $d_{SI}$ the distance between adjacent sub-pixels. These values are defined in Table 2 for the exemplary embodiment of the invention.

TABLE 2

| | |
|---|---|
| $d_{SH}$ | .25 P |
| $d_{SW}$ | .25 P |
| $d_e$ | .125 P |
| $d_{SI}$ | .25 P |

While FIGS. 7 and 8 show the distances $d_e$ and $d_{SI}$ as being equal in the horizontal and vertical directions, it is contemplated that these values may be different. The exemplary pixel structures shown in FIGS. 7 and 8 both have active pixel areas covering approximately one-fourth of the pixel area to produce a pixel aperture of approximately 25%. This value is exemplary only. The invention contemplates both larger and smaller pixel apertures.

The relatively small aperture of the pixels in the exemplary embodiment of the invention, however, provides one level of contrast enhancement. The combination of the low aperture and the spaces between the quad sub-pixels, as shown in FIG. 8 produces a further advantage by acting to conceal the pixel structure when an image is being displayed.

Another contrast enhancement is to reduce the reflection of ambient light from the surface of the display device. One way in which ambient reflection from a display surface may be reduced is to add an absorbing black matrix to any location on the display surface that does not block or absorb the light emitted by the pixel. For an emissive display, the black matrix is placed between the emitting area of the pixels. For a light-valve display, the black matrix is placed between the light valve areas. If the black matrix is properly aligned with the pixel structure, little emitted or passed light is blocked. Ambient light, however, falling on the black matrix is absorbed and does not interfere with light that is emitted by, reflected by, or passed by the pixel structures of the display device. The application of the black matrix can be done by any printing or lithography process. The shape of the black matrix can be one dimensional (e.g. lines) or two dimensional (e.g. an array of apertures). The materials of the black matrix can be any absorber (e.g. inks, paints, dyes, . . . ). A good absorber is preferred to a weaker (e.g. has greater residual reflectivity) absorber, and a "flat black" (e.g. residual reflectivity is more diffuse than reflective) is an improvement over a "glossy black" (e.g. residual reflectivity is more specular than diffuse).

Alternatively, as described below with reference to FIG. 12, the black matrix can be applied to the inside (non viewer) side of the front cover glass, or to the viewer side of the substrate. In all structures, there is a specular reflective component from any viewer side surface of the front cover glass that is not covered with black matrix (e.g. the area through which the emitted light exits, and all the area in structures where the black matrix is not applied to the viewer side of the front cover glass). Contrast improvement can be achieved by coating any of these areas with an antireflective coating. An antireflective coating will reduce the normal specular component which is typically about 5% to an amount less than that. Combinations of these black matrix locations, and combinations with antireflective coatings with the black matrix further reduce undesirable reflections.

Figure 9:
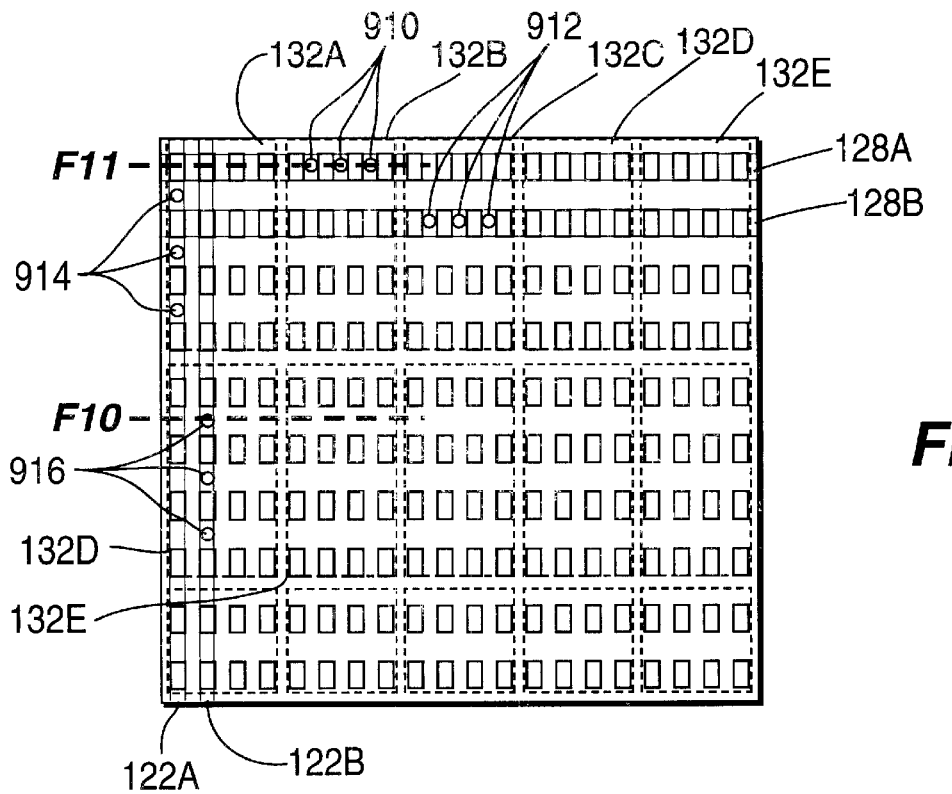
FIG. 9 is a front plan view of a tile having the structure shown in FIG. 2 which illustrates an exemplary method by which electrical connections may be made to the row and column electrodes of the tile.
Figure 10:
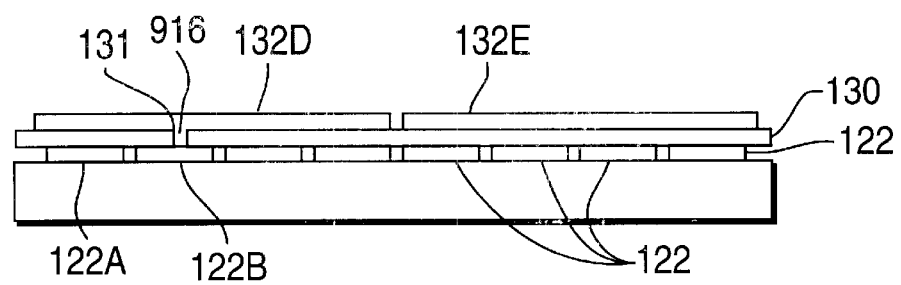
FIG. 10 is a cut-away view of the tile shown in FIG. 9 along the line F10 which illustrates an exemplary contact structure for a column electrode.
Figure 11:
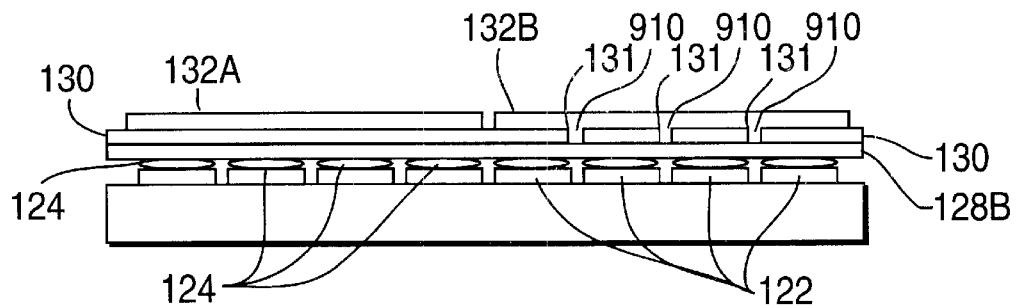
FIG. 11 is a cut-away view of the tile shown in FIG. 9 along the line F11 which illustrates an exemplary contact structure for a row electrode.

As described above with reference to FIG. 2, the electronics section of the assembled display device may include connecting plates 132 which form electrical connections to individual row or column electrodes across the area of the display. FIGS. 9, 10 and 11 illustrate an exemplary manner in which these connections may be made. FIG. 9 is a front plan view of an exemplary display device with the connecting plates 132 shown as dashed line boxes. The insulating layer 130 has been removed for clarity. FIG. 9 also includes two row electrodes 128A and 128B and two column electrodes 122A and 122B. Column electrode 122A is shown as being connected to connecting plate 132A through the vias 914. Column electrode 122B is shown as being connected to connecting plate 132D through the vias 916. Row electrodes 128A and 128B are coupled to the respective connecting plates 132B and 132C through the vias 910 and 912 respectively.

FIGS. 10 and 11 show cutaway views of a portion of the electronic section shown in FIG. 9 along the lines F10 and F11 respectively. FIGS. 10 and 11 include the insulating layer 130 which was omitted from FIG. 9. As shown in FIG. 9, the connections 916 to the column electrodes 122B are made on a region of the display device which is between active pixel elements. Thus, FIG. 10 shows only the float glass substrate 120, the column electrodes 122, the insulating layer 130, and the connecting plates 132D and 132E. The via 916 between the connecting plate 132D and column electrode 122B is made through the opening 131 in the insulating layer 130. This connection may be made for example, when the connecting plate is printed on the electronics section by allowing the silver paste or ink used in the printing process to flow through the opening 131 and make contact with the column electrode 122B.

FIG. 11 illustrates an exemplary method for making connections to the row electrodes. As shown in FIG. 9, the connections to the row electrodes are made on a portion of the display containing the active pixel elements 124. The segment of the display shown in FIG. 11 includes the glass substrate 120, transparent column electrodes 122 display material 124 and row electrode 128B. As shown in FIG. 9, the connecting plate 132B makes connection with the row electrode 128B using the vias 910. This connection is made through the openings 131 in the insulator 130. As shown in FIG. 11, there are several openings such that connection between the connecting plate 132B and row electrode 128B may be made at several locations. These multiple openings provide redundancy which increases yield in the completed display devices. Although not shown in FIG. 10, the connections to the column electrodes 122 are also made at a plurality of locations along the connecting plates. Referring to FIG. 9, for example, there are three vias 916 representing connections between the connecting plate and 132D and the column electrode 122B.

Because ITO is not as good a conductor as aluminum or silver, there may be resistive voltage drops along the column electrodes from the locations at which the electronics module 134 is connected to the column electrode. To reduce the magnitude of these resistive voltage drops, it may be desirable to connect the electronics module to each column electrode at several spaced points along the column electrode. Because these points are desirably not adjacent, it may be desirable to allocate two or even three connecting plates 132 for each column electrode 122. Thus, the number of connecting plates 132 and connecting pads 134 may be greater than the sum of the number of row electrodes and column electrodes. Alternatively, it may be desirable to form a metallic conductive trace which is in contact with the ITO electrode along the length of the display device. The conductive trace is desirably masked from view by a dark-colored material or is desirably thin to prevent specular reflections from these traces from interfering with the displayed image.

As set forth above, a structure commonly found in both tiled and non-tiled displays is a black matrix. A black matrix may be fabricated from black lines. The black matrix is typically positioned between the active portions of the pixels to absorb ambient light in these areas in order to increase the display contrast. Black matrix lines may be found, for example between the phosphors on the front screen of a CRT or between the pixel positions defined for a liquid crystal display. In tiled displays, black matrix lines are typically smaller than mullions and are typically placed in the plane of the pixels. Because the black matrix lines are periodic and placed between the pixels, they do not tend to break the continuity of the image.

The present invention employs an optical structure that may be incorporated in a tiled display to make the physical gaps between the tiles indistinguishable from the black matrix and, thus, invisible to the viewer. This integrating structure may also be used for a non-tiled display to add a black-matrix to a display device which does not have a black matrix in the plane of the emissive pixel materials.

Figure 12:
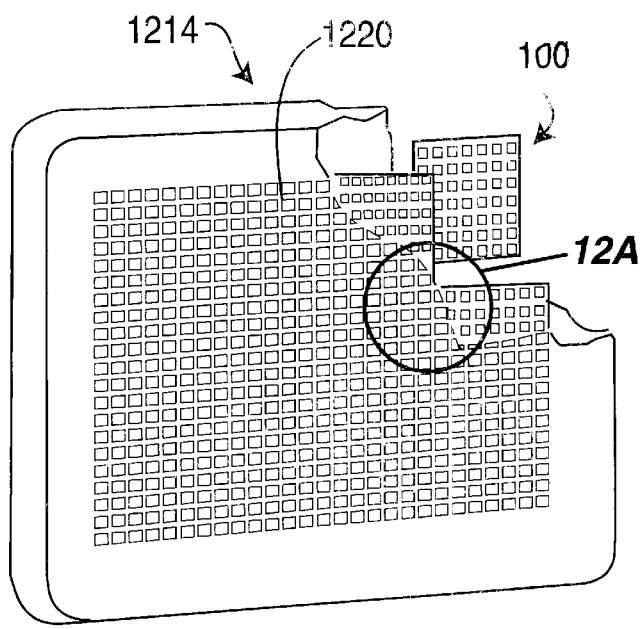
FIG. 12 is a partially exploded perspective view of a tiled display device having the structure shown in FIG. 1 or FIG. 2 which is useful for describing an exemplary mounting method and an exemplary implementation of a black matrix for the display device.
Figure 12A:
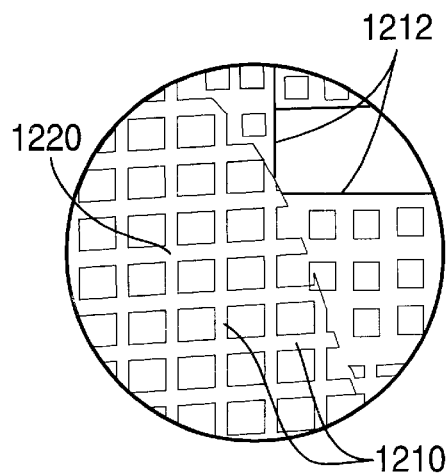
FIG. 12A is a detailed view of a portion of the partially exploded perspective view shown in FIG. 12.

An illustration of this structure is shown in FIGS. 12 and 12A. FIG. 12 is a cut-away perspective drawing of a partially assembled tiled display device. FIG. 12A shows details of a portion of the display device shown in FIG. 12. The main components of the display device are a frame 1214, a transparent sheet 1220 of, for example, glass or plastic, a plurality of black lines 2010 that form a black matrix and the tiles 100 which form the display. The key feature of the optical integrator structure is a pattern of black lines 1210 which are like black matrix lines in that they have equal widths and a spacing equal to the pixel pitch. These black lines 1210 may be aligned to lie between all pixels in the display, including those pixels on either side of the gaps 1212 between the tiles 100. The optical integrator pattern of black lines also serve as mullions in that some of the black lines in the optical integrator structure lie on top of the gaps 1212 between the display tiles 100 and block the visibility of the gaps. As assembled, the glass substrates 120 of the tiles 100 are positioned adjacent to the black lines 1210 on the back surface of the transparent sheet 1220, which forms the integrating structure.

Unlike a conventional black matrix, the disclosed optical structure for integrating display tiles is placed above the plane containing the pixels (like mullion structures), on the viewer-side of the tiles 100, with the black line pattern being in contact with the display tiles. Unlike mullions, the black lines on the optical integrator structure 1220 are relatively narrow, so that the black lines which cover the joints between tiles are essentially the same width as the black lines which form the black matrix. Thus, the disclosed structure simultaneously provides the functions of the black matrix and the mullions, but the mullion lines are not visible, as such, to the viewer because all lines in the pattern on the optical integrator structure 1220 are essentially the same and are virtually indistinguishable. Accordingly, the viewer simply sees a uniform pattern of black lines. A key feature of this aspect of the subject invention is the precise specification of the pattern of black lines and mullions on the disclosed optical integrator structure so that the physical gaps between tiles are hidden from the viewer, and at the same time so that little or no emitted light is blocked from exiting the display. In addition, the black matrix and the mullions do not disturb the continuity of the larger image, even across the gaps between tiles.

As set forth above, the front glass plate 1220 with the black matrix lines 1210 may be used with a full-size display to add a black matrix to the display device. When the display device is formed, as described above, with the active pixel elements having a dark-colored background, a front glass plate 1220 may further enhance the contrast of the display by providing a reinforcing black matrix to the display device. The use of a black matrix on such a display may also make it unnecessary to mask the reflective row and/or column electrodes with a dark material as these areas will be covered by the black matrix.

Figure 13:
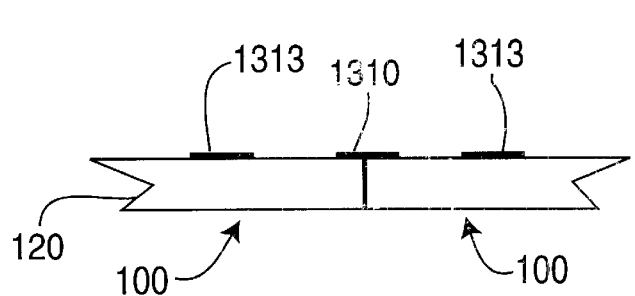
FIG. 13 is a cut-away side plan view of a portion of the glass plates of two adjacent tiles which shows how the tiles may be joined by a mullion such as that shown in FIG. 14.

To more easily describe the optical integrator structure shown in FIG. 12, a method of joining tiles using discrete mullions is first described. FIG. 13 is a cross section of portions of two tiles 100, according to the present invention, which are joined by a mullion 1310. Each of the tiles includes a glass substrate 120; the remainder of the tile structure is not shown in FIG. 13. The exemplary tiles include active display material (not shown) located proximate to the bottom surface of the glass substrate 120. The exemplary tiles also include black lines 1313 which form a portion of the black matrix.

Figure 14:
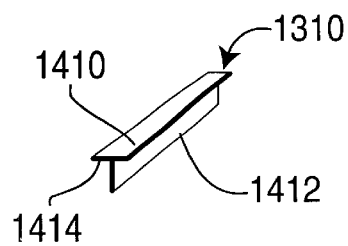
FIG. 14 is a perspective view of a mullion suitable for joining tiles to form a tiled display having contrast enhancement features according to the present invention.

FIG. 14 is a perspective drawing of an exemplary mullion 1310 suitable for use with a display device according to the subject invention. The mullion 1310 includes a top surface 1410 which may be formed from a black material or may be printed or painted black. To ensure that the mullion does not create artifacts on the display device, it is desirable for the top surface of the mullion to closely match the black stripes 1313 in size, color and gloss. The mullion 1310 also includes a bottom stem having side surfaces 1412 which are desirably formed from a light-colored material (e.g. white). Alternatively, the bottom stem of the mullion may be transparent and have an index of refraction close to that of the transparent substrate 120. It is desirable for the bottom stem of the mullion to be light-colored or transparent so that any light scattered in the vicinity of the mullion has the same properties as light that is scattered among pixels at the interior of a tile. If light scatters differently at the edge of a tile than near the center then the edge may be visible, for example, as a band of reduced brightness in the displayed image. Two or more of the side surfaces 1412 and the underside 1414 of the top bar of the mullion may be coated with adhesive to attach the mullion 1310 to the two tiles which it joins. If all of these surfaces are coated with adhesive, the mullions may be used to join the tiles into a display device without using the integrating structure 1220. In this instance, a black matrix according to the present invention may be formed on the viewer surface of the transparent substrates 120 of the individual tiles.

Figure 15:
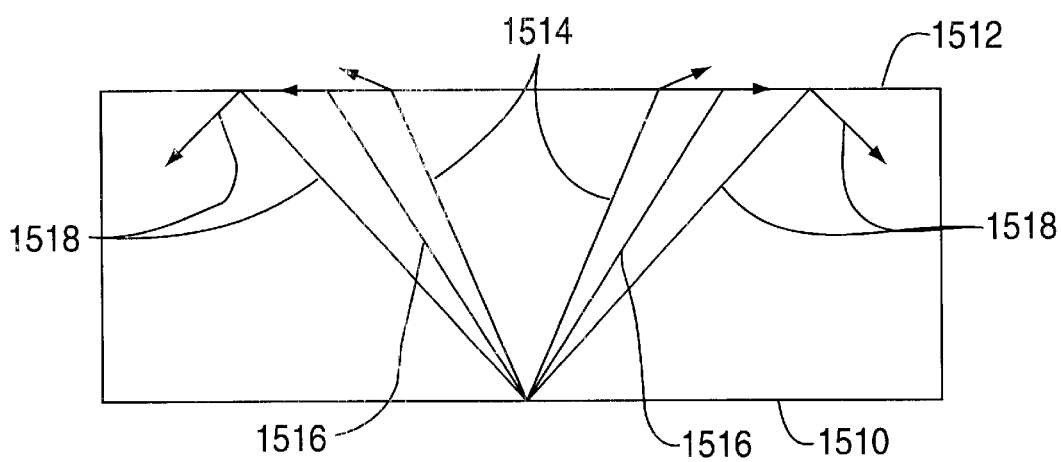
FIG. 15 is a cut-away side plan view of the glass plate of a pixel for a display device having the structure shown in FIG. 1 or FIG. 2 which is useful for describing a method for forming a black matrix for the display device.

To determine the optimum placement for a black stripe or a mullion on the front surface of the glass substrate of an emissive display, it is helpful to understand the properties of light emitted by the display. FIG. 15 shows a cross section of an exemplary glass substrate 120 which includes a bottom surface 1510 and a top surface 1512. A number of representative optical rays, 1514, 1516 and 1518 are shown emanating from a point on the bottom surface 1510. Some rays 1514 exit the glass and some rays 1518 are totally internally reflected from the top surface 1512 and are trapped in the sheet of glass. At the transition between these two types of rays are rays 1516 which are refracted to an angle parallel to the top surface 1512 of the substrate 120.

The angle of incidence of the rays 1516 which are at the transition is called the critical angle (Θc). Light reaching the surface 1512 with angles less than the critical angle exits the glass, and light reaching the surface 1512 with angles larger that the critical angle are totally internally reflected. The critical angle is dependent on the index of refraction, $n_{glass}$, of the glass substrate 120 as shown in equation (1):

$$\Theta_c = \sin^{-1}(1/n_{glass}) \quad (1)$$

In the exemplary embodiment of the invention, $n_{glass}=1.55$ and $\Theta_c \sim 40°$.

Figure 16:
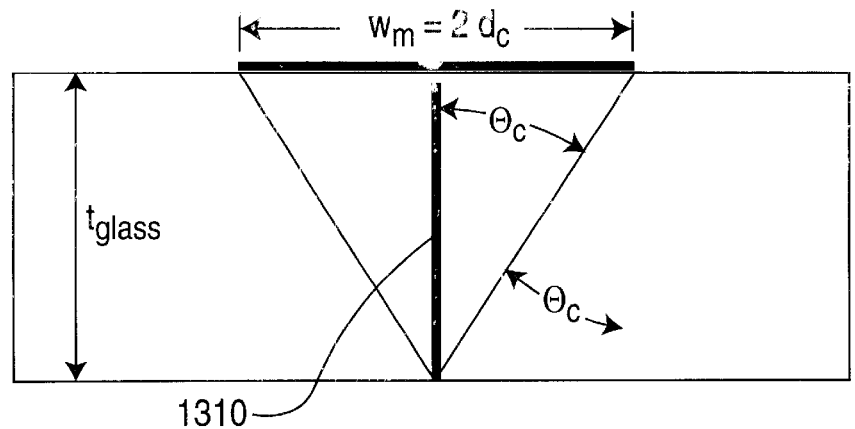
FIG. 16 is a cut-away side plan view of the glass plate of two pixels of adjacent tiles having the structure shown in FIG. 1 or FIG. 2 which is useful for describing a method for forming a black matrix across tile boundaries.

A tiled display is made of tiles that are placed in an array so that the spacing between pixels across the gap between tiles is substantially the same as the pitch between pixels within the display tiles. Thus, the display tile edge is one-half pitch distance (or slightly less) from the center of the last pixel. Because of the critical angle, light emitted from a point within a sheet of glass can travel at most a lateral distance of $d_c = t_{glass} \tan(\Theta_c)$, where $t_{glass}$ is the thickness of glass. Therefore, light from any part of a gap region may be blocked by putting a black stripe of width $W_m \geq 2 d_c$ over the gap region. Such a black stripe is shown in FIG. 16 as the top of the mullion 1310. Because of the symmetry of optics, the same black stripe blocks any external rays from making the gap region visible. Thus this black stripe makes the gap region invisible to an observer. In practice, the black stripe or the top bar of the mullion may need to be slightly wider than 2 $d_c$ to account for any finite width of the gap.

Referring, again, to the structure shown in FIGS. 12 and 12A, the individual tiles do not need to be joined by discrete mullions. Instead, the tiles may be assembled directly on the back surface of the optical integrating structure 1220 such that the gaps are positioned directly over black stripes having a width $W_m$. As shown in FIGS. 12 and 12A, the exemplary optical integrating structure 1220 is positioned on top of the array of tiles, with the black lines on the surface of the structure in contact with the glass substrates 120 of tiles. The centers of the black lines are aligned with the gaps between the tiles so that the gap regions can not be seen by an observer. Although this embodiment of the invention does not need discrete mullions, if the tiles are connected by mullions 1310, the integrating structure 1220 may include black lines that cover the top surfaces 1410 of the mullions. In this instance it would be desirable for the top bar of the mullion to be as thin as possible to minimize any gap between the top surface of the tile 100 and the back surface of the integrating structure 1220. Alternatively, the mullions 1310 may be assembled onto the integrating structure 1220 with the black matrix lines. In this configuration, the mullions form pockets into which tiles 120 are inserted to form the composite display. This structure may be formed by attaching the mullions directly to the integrating structure 1220 using an adhesive and then applying an adhesive to the undersides 1414 of the crossbars 1410 and to the sides 1412 of the stems before inserting a tile into the display.

The black lines on the optical integrating structure 1220 that form the mullions which are used to cover the inter-tile gap tend to be wider than the typical black matrix line and may block some or all of the light emitted from the pixels near the edge of the tile. To allow the maximum amount of light to pass and yet avoid any artifact distortion in the assembled display device, the display tiles and the black stripes on the integrating structure 1220 are desirably specifically designed to have particular relationships.

Figure 17:
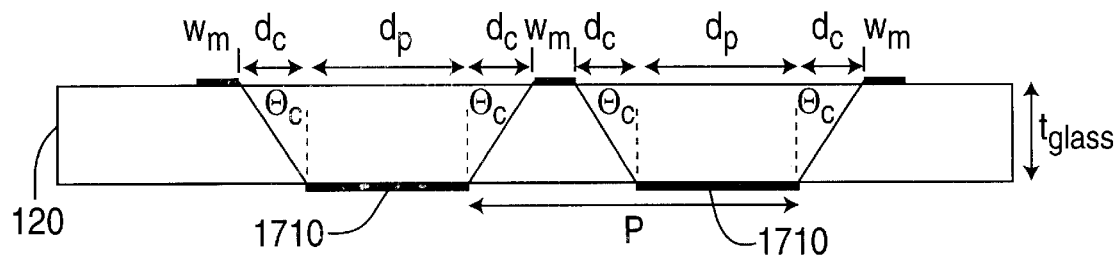
FIG. 17 is a cut-away side-plan view of adjacent pixels of a display device such as that shown in FIG. 1 or FIG. 2 which is useful for describing a method for forming a black matrix for the display device.

FIG. 17 shows a cross section of a pixel which includes two pixel regions. The emissive regions 1710 at the bottom of the glass substrate 120 have a width $d_p$. The light rays that can exit the glass section and are useful for viewing, exit the top of the glass 120 in an area having a width $w=2d_c+d_p$. A display device has an array of pixels equally spaced a distance known as P, the pixel pitch. Therefore, to not block any viewable light, it is desirable for the black matrix to have a width, $W_m \leq P-d_p-2d_c$. The dimensions illustrated in FIG. 17 depict the case where the black matrix stripe blocks no emitted light.

When the thickness of the glass substrate 120 and the width of the black stripe satisfy the criteria described above, no light that is directed toward a viewer directly in front of the display (e. g. viewing from a normal angle) is blocked, but some light from greater viewing angles may be blocked. Meeting these criteria, however, leads to improved contrast since the fraction of the display occupied by the black matrix is larger. In other words, some blockage of light from wider viewing angles may be considered acceptable as being advantageous for higher contrast at normal viewing angles.

As described above, in the exemplary embodiment of the invention, the pixels on the exemplary display device have an aperture of approximately 25% in order to allow room within the pixel for a via to make electrical contact with a column electrode. Thus, in the exemplary embodiment of the invention, $d_p$ is approximately P/2. This relatively small aperture also has advantages by making it easier to hide the inter-tile gap and allowing a relatively large stripe size for the black matrix to improve the contrast of the display.

There are two criteria for the width of the black stripes: $W_m \geq 2d_c$ (needed to hide the gap), and $W_m \leq P-d_p-2d_c$ (needed to avoid blocking light from the pixels). These criteria are plotted for one example (i. e. $P=2w_p$) in FIG. 18. The design conditions that simultaneously makes the gap invisible and does not block any visible are shown on FIG. 18 as the desirable region 1810 of choices for the glass thickness and the black stripe width. The most desirable solution is the design point 1812 having the greatest glass thickness, at the top of the acceptable region. At this point, the thickness of the glass is 0.015P and the width of the black stripe is 0.25P. Designing the display module and black matrix stripes to meet that condition results in making a large area display by integrating individual modules behind the integrating structure 1220 with the result that the individual modules are not detectable by the gaps between them.

Figure 18:
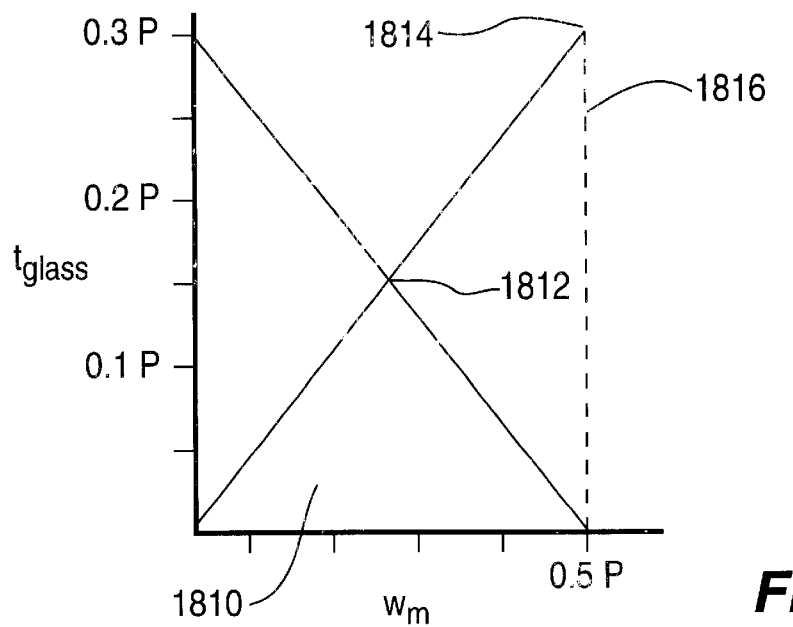
FIG. 18 is a graph of glass thickness versus black matrix line width which is useful for describing a contrast enhancement feature according to the present invention.

At the design point 1812, light is not blocked at any viewing angle. The design condition 1814 in FIG. 18 is better than design point 1812 because it provides the maximum contrast and maximum thickness glass but with a significant loss in the brightness of the display device for off-axis viewing. In the triangle 1816, some light is blocked off axis but contrast is improved by reducing ambient reflection.

It is contemplated that the contrast may be further improved by coating the viewer-side of the integrating structure 1220 with an antireflection coating and/or by adding an ambient light absorber or color filter, such as the filter 121 described above with reference to FIG. 1, on that surface or in the bulk of the material (e.g. glass or plastic) from which the optical integrating structure 1220 is constructed.

It is also contemplated that the integrating structure 1220 may include a diffuser coating on the viewer-side surface. This diffuser enlarges the apparent size of the pixels reducing the visibility of the individual pixels and black matrix structure. Thus, a diffuser may act to reduce the graininess of the displayed image. The diffuser also acts to reduce specular reflections. Accordingly, at viewing angles which include specular reflections, the diffuser enhances image contrast. This may be significant, especially for display devices having relatively large pixels or which have smaller pixels but are designed to be viewed at close proximity to the display device.

Another method of reducing the visibility of the pixel structure is to employ a quad pixel structure having separated sub-pixels, as described above with reference to FIG. 8. This pixel structure provides relatively high levels of brightness even in display technologies which do not have a bright phosphor for one color. The separated sub-pixels of this quad sub-pixel structure also provide good contrast and an apparent increase in spatial resolution.

The integrating structure 1220 provides a relatively simple yet accurate way to align and mount the individual tiles of a tiled display device. In particular the patterns on the integrating structure 1220 may be accurately aligned with the pixels using, for example moiré patterns, to position a tile and then the tile may be mounted onto the structure 1220 with an optically clear adhesive, for example, a ultra-violet curable epoxy.

The present invention contemplates other methods than the integrating structure for providing a black matrix on a display device. One method is to form the black matrix from a light-absorbing material on the viewer surface of the glass substrate 120. Another is to include a light absorbing material close to the plane of the pixel, for example, as the item 121 shown in FIG. 1. If an absorbing material is used outside of the active pixel areas of a display device, then is desirable to minimize the size of the emissive area and maximize the area of the absorber while maintaining a minimum brightness level. A display having the desired structure has a relatively small aperture. In terms of image contrast, a display having a small aperture and inactive pixel areas covered by an absorbing material is exhibits better contrast performance than a with larger apertures. Small aperture displays work best, however, when the display material generates, passes or reflects sufficient light to meet the brightness requirements of the display device, and when the cover glass is thin compared to the aperture opening.

It is also possible to achieve these goals with a structure in which the aperture is small but the active area of the pixel is relatively large (e.g. approximately 50 percent). For tiled displays, it is desirable for the active pixel area to be small enough to allow vias to be formed in the inactive areas of the display. One method to achieve these goals is with a pixel structure that includes a lens structure which reflects or refracts light provided by the relatively large active pixel area and channels it through a relatively small aperture. As set forth above, it is desirable for the aperture of the display with the lenses to be less than or equal to 25 percent. The reflecting structures of the pixel may use refractive optics, refractive internal reflection, light piping, or surfaces coated with a reflective material. In an optimum configuration, the light provided by the active area of the pixel is reflected a minimal number of times but possibly multiple times, until it passes through the exit aperture. As set forth above, one negative artifact of the reduced size aperture is the increased visibility of individual pixels. The larger separation between adjacent pixels and the greater contrast in the display device make the individual pixels more visible. One way of hiding the pixel structure is to place a low reflectance diffusing or a diffracting surface (e.g. a spatial diffractive filter) in front of the viewer side of the front cover glass. This causes the active pixel areas to appear larger to the viewer.

One method by which the light provided by a relatively large active pixel area may be reduced to pass through a relatively small aperture is illustrated in FIG. 19. In this structure, lenses 1910 are formed on the viewer side of the front cover glass 120 and aligned with the emissive or light-valve portions 1912 of the pixels. As shown in FIG. 19, the area occupied by the active areas 1912 of the pixels is larger than the opening in the lens 1910 through which the light is emitted. Alternatively, for larger pixels, or for pixels arranged in a quad structure, such as is shown in FIG. 8, more than one lens may be formed for each pixel and placed as an array or as a random grouping in front of each pixel. This lens desirably has a clear aperture from which light provided by the active portion of the pixel is emitted to the viewer area. As described above, for maximum contrast, it is desirable for the size of this aperture to be as small as optics permit. The top surface 1914 of this aperture is desirably not planar so that specular reflective components are minimized. This surface may be convex, concave, or any shape desired. The sides of the lens structures are desirably reflective.

Reflectivity can be imparted to the walls of the lens structure 1910 either by selecting a material for the lens that has a refractive index that results in total internal reflectivity or by applying a reflective coating to the sides of the lens. The bottom surface of the lens (near to the active area 1912 of the pixel) is desirably as wide as possible so that as much light as possible enters the structure (e.g. the area of the bottom of the lens should approximate the size and shape as the active area of the pixel and positioned in close proximity to the active area). The area 1916 between the lenses on the viewer side is desirably filled with a light absorptive material to form a black matrix around the apertures in the lenses 1910. This black matrix may fill the spaces or coat the surfaces between the sides of neighboring lens structures to conform to the sides between the lenses. In this configuration, there are no flat areas between the lenses that can result in a specular reflection. The black matrix fill which conforms to the side of the lens is shown in phantom in FIG. 19 as 1917. The refractive index of the black material is an important consideration. If the refractive index of this material is less than that of the lens, the light provided by the active pixel element may not be totally internally reflected and, thus, may be absorbed by the black material. This may be prevented by selecting a black material which has an lower index of refraction or by pre-coating the black-matrix area with a material having a low index of refraction before applying the black material.

It is desired that any specular component of the ambient light landing on the black matrix on the sides of the lens be reflected at an angle such that it strikes the black matrix on a neighboring lens. Thus the structure 1917 forms a light trap for ambient light. The steeper the angles on the sides of the lenses the better is the light trapping. The strong light suppression achieved by the black matrix structure 1917 results from trapping the light. This structure is more effective than using materials which absorb the light, and the lack of any planer component of the surface greatly reduces any specular component for light reflected from the surface of the display device. Indeed, because of the light trapping, significant contrast enhancement occurs in a lens structure such as that shown in FIG. 19 even without the black material in the areas 1916 between the lenses.

There is some fraction of the emitted light that is reflected by the lens structure back into the pixel rather than being emitted. This loss can be minimized, however, by having as reflective a pixel as possible, thus this light is reflected again and has another opportunity to be emitted. Some ambient light may land on the aperture and interfere with light that is emitted from the lens structure. This may occur, for example, when ambient light enters the lens and is returned to the viewer space after several reflections inside the lens structure. This effect may be reduced by coating the lens structure 1910 with a material (such as a color filter) that transmits the emitted light, but absorbs all other wavelengths or polarizations. Another improvement may be to coat the viewer side of the lens aperture with an antireflecting coating to suppress the small component that would otherwise be reflected from the small aperture area.

The lenses 1910 may be formed on the viewer surface of the cover plate 120 during the construction of the display device using any forming technique that is compatible with the display technology. Alternatively, they may be formed in a separate operation and then aligned with, and laminated to the display surface with an optical adhesive. The shape of the lens in the plane of the display surface can include both one dimensional (linear lenticular lenses), and two dimensional (discrete lens arrays). Two dimensional arrays provide the greatest contrast improvement. The sides of the lenses can be straight or curved (convex, concave or both). The aperture at the top of the lenses (viewer side) may be straight, or curved (convex, concave, or combinations of both), but straight and parallel to the plane of the display is not the preferred shape because it contributes to specular reflection The combined shapes of the sides of the lenses 1910 and the apertures of the lenses together with the properties of the light emitted by the active emission region of the pixel determine the distribution of light that is emitted from the display. As is well know, by selecting the lens material based on its refractive index and by suitably designing the reflecting structures on the sides of the lenses, emission of light from the lens aperture at angles up to plus and minus 90 degrees horizontally and vertically is possible. It may be desirable to design the lens structures 1910 to tailor this distribution in a way which concentrates the displayed light in the likely viewer directions. This provides some gain in observed brightness relative to the display surface without the optics. This tailoring of the light distribution may also improve the perceived contrast of the display device for these preferred directions.

The right side of FIG. 19 and FIG. 20 show examples of bottom emitting OLED displays. Each of these examples consists of two structures, an electronics section 102 and a display section 104, each composed of multiple layers. The display section consists of a glass substrate 120 on which are deposited active display materials 1912' including transparent hole injecting electrodes (e.g. ITO), OLED material(s), electron injecting electrodes (e.g. calcium), and contact layer(s) 1922. Light is emitted by the OLED material(s) and exits the display through the transparent electrode and glass substrate (this is termed a bottom emitter structure because the light exits through the substrate for the OLED material). The electronics section 102 consists of an insulating substrate 110 with contact layer(s) 1920 that match the contact layers 1922 on the display layers, electrical vias 112 that connect these contacts to conductors on the other surface, and an IC(s) 134. The electronics section 102 simultaneously functions as a barrier layer for sealing the display, a back substrate for the display, and as an electrical circuit board. These two structures form a display by joining them with a material 1924 that simultaneously makes electrical connection between the matching contacts on the display and circuit board structures, encapsulates the OLED materials (sealing them from oxygen and water vapor), and adheres these two structures together.

The material used to join the display and circuit board layers typically is made with epoxy resins, other two part heat or photo curable adhesives, moisture catalyzed adhesives, and thermoset or thromoplastic polymers that are loaded with conductive additives such as conducting particles, particles with a conducting coating, conducting filaments, conducting flakes, and conducting filaments and flakes that are magnetic. These materials are not typically black.

This material may be made black by adding a black pigment or dye. Carbon black is an example of a suitable black pigment. If carbon black is added at too high a concentration it will make the sealing material too conductive and interfere with making contacts. Concentrations from 0.1% to 10% (based on weight) effectively absorb light but do not make the sealing material too conductive. Black organic dyes do not add conductivity. These may be added in concentrations that make the sealing material a good light absorber.

These black sealing materials may be applied as a fluid or paste, but may also be supplied as a preformed sheet or as a powder. Examples of processes for applying the seal/contact materials can include printing (silk screen, inkjet, contact, roller, and others); dispensing from a syringe or similar dispenser; or doctor blade coating. Actual mechanical bonding results from the adhesive nature of the seal materials. Examples of processes for activating adhesion include catalysts, heat, or electromagnetic energy, or alternatively, physical processes such as ultrasonic welding and pressure may be used. The asymmetric electrical properties are imparted to these seal/conductor materials by performing an asymmetric unit process. Examples of asymmetric processes for achieving asymmetrical conductivity are application of pressure, material flow, electric field or magnetic field alignment, and electromigration.

As described above with reference to FIGS. 1 and 2, because the electron injecting electrodes are located between the viewer and the black sealing material, these electrodes may contribute to specular reflections which locally reduce the contrast of the display. Reflections from these electrodes can be minimized by minimizing their area or by coating the viewer side of these electrodes black. Minimizing their area simultaneously maximizes the area of the black material available to absorb ambient light. Coating the viewer side of the electron injecting electrode black can be accomplished by first depositing a black coating in all areas where metal electrodes will be later deposited.

Although the invention has been described in terms of exemplary embodiments, it is contemplated that it may be practiced as generally described above within the scope of the appended claims.

What is claimed:

1. A display device having a plurality of picture element (pixels), comprising:

a pixel structure for the plurality of pixels which pixel structure defines a pixel area including an active pixel area, which includes an emissive display material and an inactive pixel area in which only the active pixel area emits light and in which the ratio of the active pixel area to the pixel area is less than 50 percent;

a transparent cover plate having a outer surface and an inner surface wherein the inner surface is in close proximity to the pixel area and where part of the emitted light from the active pixel area passes through the transparent cover plate and another part is reflected internally by the outer surface of the transparent cover plate;

a black matrix formed on the outer surface of the transparent cover plate, the black matrix defining openings surrounded by a dark colored material, the openings being aligned with the active pixel areas of the display device and being in contact with the display and through which the emitted light from the active pixel area passes.

2. A display device according to claim 1, wherein the pixel area has width P including an active pixel area which has a width $d_p$ and the transparent cover plate has an index of refraction $n_{glass}$, which defines a critical angle of $\Theta c$, and a thickness $t_{glass}$ and the black matrix is formed from dark-colored stripes having a width $W_m$ defined by the inequality $W_m \leq P-2 \ (t_{glass} \tan (\Theta c))-d_p$.

3. A display device according to claim 2, wherein the width, $W_m$, of the black matrix stripes is further defined by the inequality $W_m \geq 2d_c$ is the lateral distance traveled by the active pixel light emitted from a point within the transparent cover plate.

4. A display device according to claim 1, wherein transparent cover plate has an index of refraction $n_{glass}$, which defines a critical angle of $\Theta c$, and a thickness $t_{glass}$ and the black matrix is formed from dark-colored stripes having a width $W_m$ defined by the inequality $W_m \geq 2d_c$ wherein $d_c$ is the lateral distance traveled by the active pixel light emitted from a point within the transparent cover plate.

5. A display device according to claim 1, further comprising a filter positioned over the plurality of pixels to pass light provided by the active pixel areas and to attenuate ambient reflected light which passes through the transparent cover plate and the filter and is reflected by the pixel areas of the display device.

6. A display device according to claim 5, wherein the filter is a neutral gray filter.

7. A display device according to claim 5, wherein the filter is a patterned color filter.

8. A display device according to claim 5, wherein the filter is a polarizing filter.

9. A display device according to claim 1, wherein the outer surface of the transparent cover plate includes an anti-reflective coating.

10. A display device according to claim 1 wherein the pixel structure includes a row electrode and a column electrode for driving the pixel structure, wherein the display device includes an electronics section, coupled to the inner surface of the transparent cover plate, the electronics section including a circuit board which provides electrical signals to the row electrodes and the column electrodes of the pixel structure.

11. A display device according to claim 10, wherein the circuit board is made from a dark-colored material to provide a light-absorptive background for the active pixel area.

12. A display device according to claim 10, wherein the circuit board is joined to the inner surface of the transparent cover plate by an adhesive and the adhesive includes dark-colored material whereby the assembled display device provides a light-absorptive background for the active pixel area.

13. A display device according to claim 10, wherein the column electrodes are transparent and are formed directly on the transparent cover plate, the display material is deposited on the column electrodes and row electrodes are deposited on the display material and on portions of the transparent cover plate, wherein, before depositing the row electrodes, the portions of the transparent cover plate on to which the row electrodes are to be deposited are coated with a dark-colored material.

14. A display device according to claim 1, wherein the display device is a tiled display device including an optical integrator plate and the black matrix is formed on the surface of the optical integrator plate on to which the individual tiles are mounted.

15. A display device according to claim 1, wherein the active area of the pixel structure defines a plurality of spaced sub-pixel elements separated by portions of the inactive pixel area, wherein the sub-pixel elements together define an aperture of less than 50 percent.

16. A display device according to claim 15, wherein the active area of the pixel structure defines a plurality of spaced sub-pixel elements separated by portions of the inactive pixel area, wherein the sub-pixel elements together define an aperture of approximately 25 percent.

17. A display device having a plurality of picture element (pixels), comprising:

a pixel structure for the plurality of pixels which pixel structure defines a pixel area including an active pixel area, which includes an emissive display material and an inactive pixel area in which only the active pixel area emits light and in which the ratio of the active pixel area to the pixel area is less than 50 percent;

a transparent cover plate having a outer surface and an inner surface wherein the inner surface is in close proximity to the pixel area and where part of the emitted light from the active pixel area passes through the transparent cover plate and another part is reflected interally by the outer surface of the transparent cover plate;

a black matrix formed on the outer surface of the transparent cover plate, the black matrix defining openings surrounded by a dark colored material, the openings being aligned with the active pixel areas of the display device and being in contact with the display and through which the emitted light from the active pixel area passes and the black matrix being operable to block light emanating from the inactive pixel areas.

* * * * *